United States Patent
Yang et al.

(10) Patent No.: US 9,911,789 B2
(45) Date of Patent: Mar. 6, 2018

(54) 1-SELECTOR N-RESISTOR MEMRISTIVE DEVICES

(71) Applicant: Hewlett Packard Enterprise Development LP, Houston, TX (US)

(72) Inventors: Jianhua Yang, Palo Alto, CA (US); Gary Gibson, Palo Alto, CA (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/128,244

(22) PCT Filed: Apr. 10, 2014

(86) PCT No.: PCT/US2014/033583
§ 371 (c)(1),
(2) Date: Sep. 22, 2016

(87) PCT Pub. No.: WO2015/156805
PCT Pub. Date: Oct. 15, 2015

(65) Prior Publication Data
US 2017/0110515 A1     Apr. 20, 2017

(51) Int. Cl.
| | |
|---|---|
| *G11C 11/00* | (2006.01) |
| *H01L 27/24* | (2006.01) |
| *H01L 45/00* | (2006.01) |
| *G11C 13/00* | (2006.01) |

(52) U.S. Cl.
CPC ........ *H01L 27/2481* (2013.01); *G11C 13/004* (2013.01); *G11C 13/0069* (2013.01); *H01L 45/1226* (2013.01); *H01L 45/1233* (2013.01); *H01L 45/146* (2013.01)

(58) Field of Classification Search
CPC ............. G11C 13/0007; G11C 13/003; G11C 13/0069; G11C 13/0002; G11C 2213/19; G11C 2213/55; G11C 2213/56; G11C 13/0011; G11C 2013/0073; G11C 2213/52; G11C 2213/73; G11C 11/16; G11C 13/004
USPC ....... 365/148, 163, 151, 100, 129, 157, 158, 365/189.011, 189.15, 189.16, 51, 63
See application file for complete search history.

(56) References Cited

U.S. PATENT DOCUMENTS

| | | | |
|---|---|---|---|
| 6,515,897 | B1 | 2/2003 | Monsma et al. |
| 6,781,910 | B2 | 8/2004 | Smith |
| 7,634,851 | B2 | 12/2009 | Tuttle |
| 2004/0114428 | A1 | 6/2004 | Morikawa |

(Continued)

OTHER PUBLICATIONS

International Searching Authority, The International Search Report and the Written Opinion, PCT/US2014/033583, dated Jan. 8, 2015, 12 Pgs.

(Continued)

*Primary Examiner* — Thong Q Le
(74) *Attorney, Agent, or Firm* — Mannava & Kang, P.C.

(57) ABSTRACT

A 1-Selector n-Resistor memristive device includes a first electrode, a selector, a plurality of memristors, and a plurality of second electrodes. The selector is coupled to the first electrode via a first interface of the selector. Each memristor is coupled to a second interface of the selector via a first interface of each memristor. Each second electrode is coupled to one of the memristors via a second interface of each memristor.

15 Claims, 5 Drawing Sheets

(56) References Cited

U.S. PATENT DOCUMENTS

| | | |
|---|---|---|
| 2009/0027976 A1 | 1/2009 | Brewer et al. |
| 2010/0008124 A1 | 1/2010 | Scheuerlein et al. |
| 2012/0135580 A1 | 5/2012 | Scheuerlein et al. |
| 2013/0043452 A1 | 2/2013 | Meyer et al. |
| 2016/0254448 A1* | 9/2016 | Choi ................. H01L 45/08 |

OTHER PUBLICATIONS

Mojumder, N.N. et al., Dual Pillar Spin-Transfer Torque MRAMs for Low Power Applications, ACM Journal on Emerging Technologies in Computing Systems, vol. 9, No. 2, Article 14, May 4, 2013, 17 pages.

* cited by examiner

1-SELECTOR N-RESISTOR MEMRISTIVE DEVICES

BACKGROUND

Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1." Large crossbar arrays of memristive elements can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are devices that may be used as components in a wide range of electronic circuits, such as memories, switches, radio frequency circuits, and logic circuits and systems. In a memory structure, a crossbar array of memristive devices may be used. When used as a basis for memories, memristors may be used to store bits of information, 1 or 0. When used as a logic circuit, a memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

The resistance of a memristor may be changed by applying an electrical stimulus, such as a voltage or a current, through the memristor. Generally, at least one channel may be formed that is capable of being switched between two states one in which the channel forms an electrically conductive path ("ON") and one in which the channel forms a less conductive path ("OFF"). In some other cases, conductive paths represent "OFF" and less conductive paths represent "ON". Conducting channels may be formed by ions and/or vacancies. Some memristors exhibit bipolar switching, where applying a voltage of one polarity may switch the state of the memristor and where applying a voltage of the opposite polarity may switch back to the original state. Alternatively, memristors may exhibit unipolar switching, where switching is performed, for example, by applying different voltages of the same polarity.

Using memristors in crossbar arrays may lead to read and/or write failure due to sneak currents passing through the cells that are not selected—for example, cells on the same row or column as a targeted cell. Failure may arise when the total current from an applied voltage is higher or much higher than the current through the targeted memristor due to current sneaking through untargeted neighboring cells. Using a transistor with each memristor has been proposed to isolate each cell and overcome the sneak current. However, using a transistor with each memristor in a crossbar array limits array density and increases cost, which may impact the commercialization of memristive devices. As a result, effort has been spent to investigate using a selector or selection device with each memristor in order to increase the current-voltage nonlinearity of each cell of a crossbar array. However, currently many proposed selectors may not be able to handle the current density needed to switch a memristor. In such circumstances, the selectors may not allow enough current through to each memristor.

Examples disclosed herein provide for 1-Selector n-Resistor (1SnR) memristive devices. In example implementations, a memristive device includes a selector coupled to n-number of memristors, where n is a number greater than one. Without subscribing to any particular theory, electrical conductors generally decrease in resistance with increasing size. Accordingly, a selector large enough to be coupled to more than one memristor may have sufficiently low resistance to allow enough current to switch a targeted memristor.

In this manner, a selector may be used with memristors in a crossbar array in order to increase nonlinearity and suppress sneak currents. The integrated structures of example 1SnR memristive devices may lower the costs of and improve feasibility for the use of large crossbar arrays of memristors. Furthermore, example memristive devices utilizing crested tunnel barrier selectors exhibit high endurance, which allows example devices to remain functional after a potentially large number of use cycles. These features may allow the creation of highly integrated memory architectures.

Figure 1A:
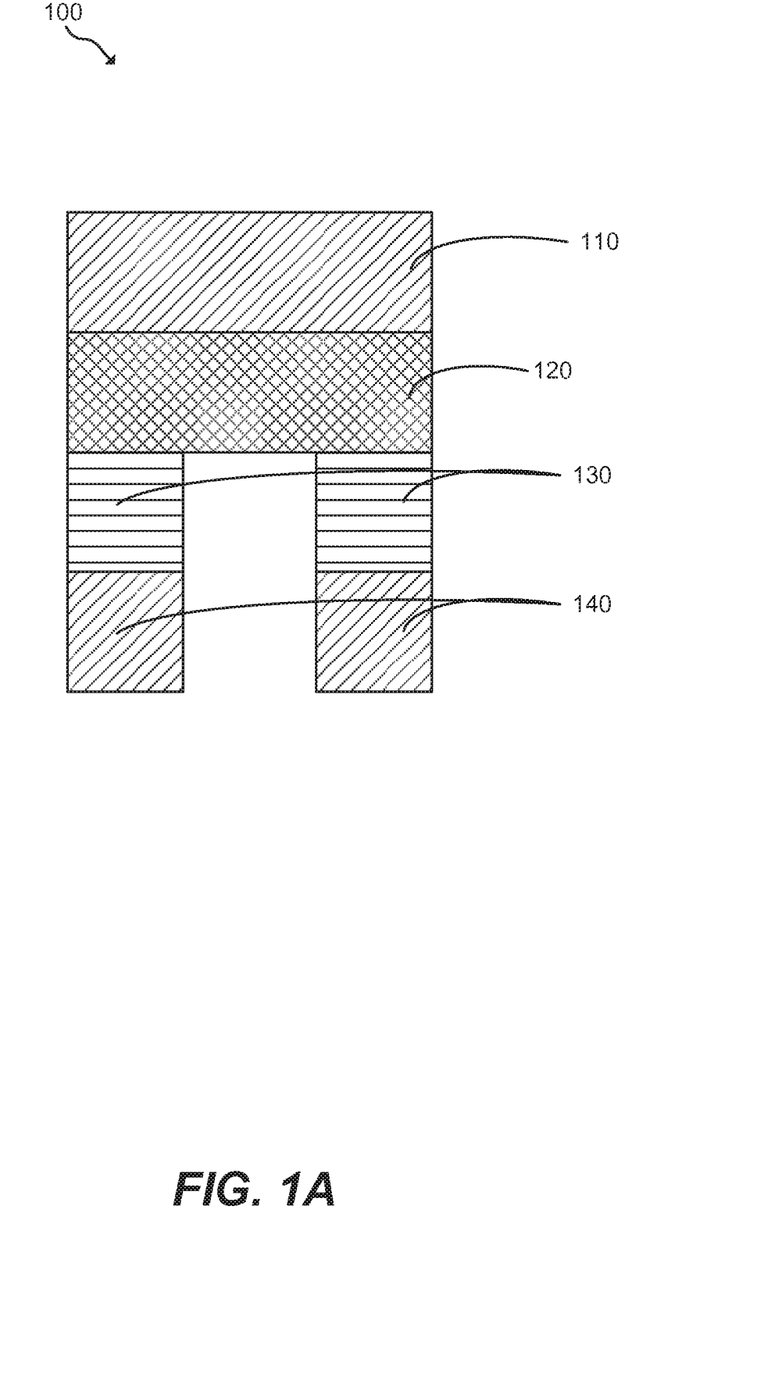
FIG. 1A is a cross-sectional view of an example 1-Selector n-Resistor memristive device.

Referring now to the drawings, FIG. 1A depicts an example 1-Selector n-Resistor memristive device 100 having a first electrode 110, a selector 120 coupled to first electrode 110, a plurality of memristors 130 coupled to selector 120, and a plurality of second electrodes 140 coupled to memristors 130. Selector 120 may be coupled to first electrode 110 via a first interface of selector 120. Memristors 130 may be coupled to a second interface of selector 120 via a first interface of each memristor 130. Second electrodes 140 may be coupled to a second interface of each memristor 130. In some examples, each memristor 130 may be coupled to one second electrode 140. In these examples, each second electrode 140 may be coupled to one memristor 130 from among the memristors 130 sharing the same selector 120.

FIG. 1A depicts an example 1S2R memristive device, but it should be understood that there are many variations of 1SnR memristive device 100. In one implementation, memristive device 100 may be a 1S4R memristive device, having four memristors coupled to a selector. In other instances, memristive device 100 may have up to 64 memristors 130 coupled to selector 120. In some instances, memristors 130 may have a linear current-voltage relationship in the low resistance state (LRS). In some other examples, memristor 130 may itself exhibit a current that varies non-linearly with voltage. In such instances, memristive device 100 may have even more memristors 130 coupled to selector 120.

Coupling the elements of memristive device 100 may form a continuous electrical path so current may travel through first electrode 110, selector 120, memristors 130, and second electrodes 140. The resistance of a memristor 130 may change with an applied voltage across or current through memristor 130. Furthermore, a memristor 130 may "memorize" its last resistance. In this manner, each memristor 100 may be set to at least two states. Each memristor 130 may, for example, be a single memory cell in a crossbar array. An array of multiple memristive devices 100 containing a plurality of memristors 130 may, for example, be utilized in nonvolatile resistive memory, such as resistive random access memory (RRAM).

Memristor 130 may be based on a variety of materials. Memristor 130 may be oxide-based, meaning that at least a portion of the memristor is formed from an oxide-containing material. Memristor 130 may also be nitride-based, meaning that at least a portion of the memristor is formed from a nitride-containing composition. Furthermore, memristor 130 may be oxy-nitride based, meaning that a portion of the memristor is formed from an oxide-containing material and that a portion of the memristor is formed from a nitride-containing material. In some examples, memristor 130 may be formed based on tantalum oxide ($TaO_x$) or hafnium oxide ($HfO_x$) compositions. Other example materials of memristor 130 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein.

Selector 120 may be an electrical component placed in series with memristor 130 that controls the overall electrical properties of the resulting combination. In many examples, selector 120 may have current-voltage nonlinearity. In other words, when the voltage applied across selector 120 is changed, the current passing through the selector 120 changes by a factor, "k". Generally, the factor "k" may be a function of voltage. For example, selector 120 may exhibit I-V nonlinearity with a "k" of at least 10 in a voltage range of interest. In some examples, factor "k" may vary depending on the voltage applied. For example, the current change between an applied one volt and two volts may be different than the current change between two volts and three volts.

Selector 120 may be any type of selector, but in some examples, selector 120 may be a crested tunnel barrier selector. A crested tunnel barrier selector may possess a crested energy barrier with a height peak in the middle barrier. An electric field may reduce the peak barrier height of the crested barrier more significantly than the peak barrier height of a rectangular energy barrier, which some memristors and other types of selectors may possess. Therefore, the tunneling current through the crested energy barrier may change more abruptly with an applied electric field, leading to a higher degree of nonlinearity. Thus, when electric current is passed through the series combination of selector 120 and memristor 130, the I-V characteristics of memristor device 100 may be primarily reflective of the properties of selector 120, including at low voltage. Further details regarding selector 120 are discussed below in reference to FIG. 2.

First electrode 110 and second electrode 140 may have an electrically conducting material, such as a metal like platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), or titanium (Ti), or an electrically conducting metal nitride, such as $TiN_x$ or $TaN_x$. In some implementations, first electrode 110 and second electrode 140 may include the same material. For example, both may be tantalum nitride. Alternatively, first electrode 110 may have a different material than second electrode 110. For example, first electrode 110 may be tantalum nitride while second electrode 140 may be platinum.

Examples of memristive device 100 as described above may possess high endurance values. A high endurance value generally means the device retains its properties after repeated use. In one example, memristive device 100 may exhibit endurance of at least $10^3$, meaning memristive device 100 remains functional after at least 1000 cycles. As used herein, a cycle may refer to an application of a read voltage or write voltage, or both. In some implementations of memristive device 100, endurance of over $10^8$ may be achieved. In particular, a memristive device 100 with a crested tunnel barrier selector 120 may provide notably high endurance. As described above, a crested tunnel barrier selector utilizes an electric field for switching states and does not involve atomic motion. As such, a crested tunnel barrier selector may remain robust after a large number of cycles.

In some implementations, memristive device 100 may be formed by a variety of techniques. For example, the components of memristive device 100 may be formed individually and stacked together in layers. Some example techniques may include ion beam assisted deposition, sputtering, atomic layer deposition, evaporation, and chemical vapor deposition.

When used in a crossbar array, such as in memory applications, memristive device 100 may have a two-dimensional structure. For example in a crossbar array, memristive device 100 may have a plurality of first electrodes 110, a plurality of selectors 120, a plurality of memristors 130 for each selector 120, and a plurality of second electrodes 140, each connecting to multiple memristors 130. In such an array, first electrodes 110 may run parallel on a first axis (such as an x-axis), each coupled to at least one selector 120. Each selector 120 may be coupled to a plurality of memristors 130. Second electrodes 140 may run parallel on a second axis (such as an y-axis), each coupled to at least one memristor 130 but no more than one memristor 130 that is coupled to each selector 120. Such a structure allows for large crossbar arrays.

Figure 1B:
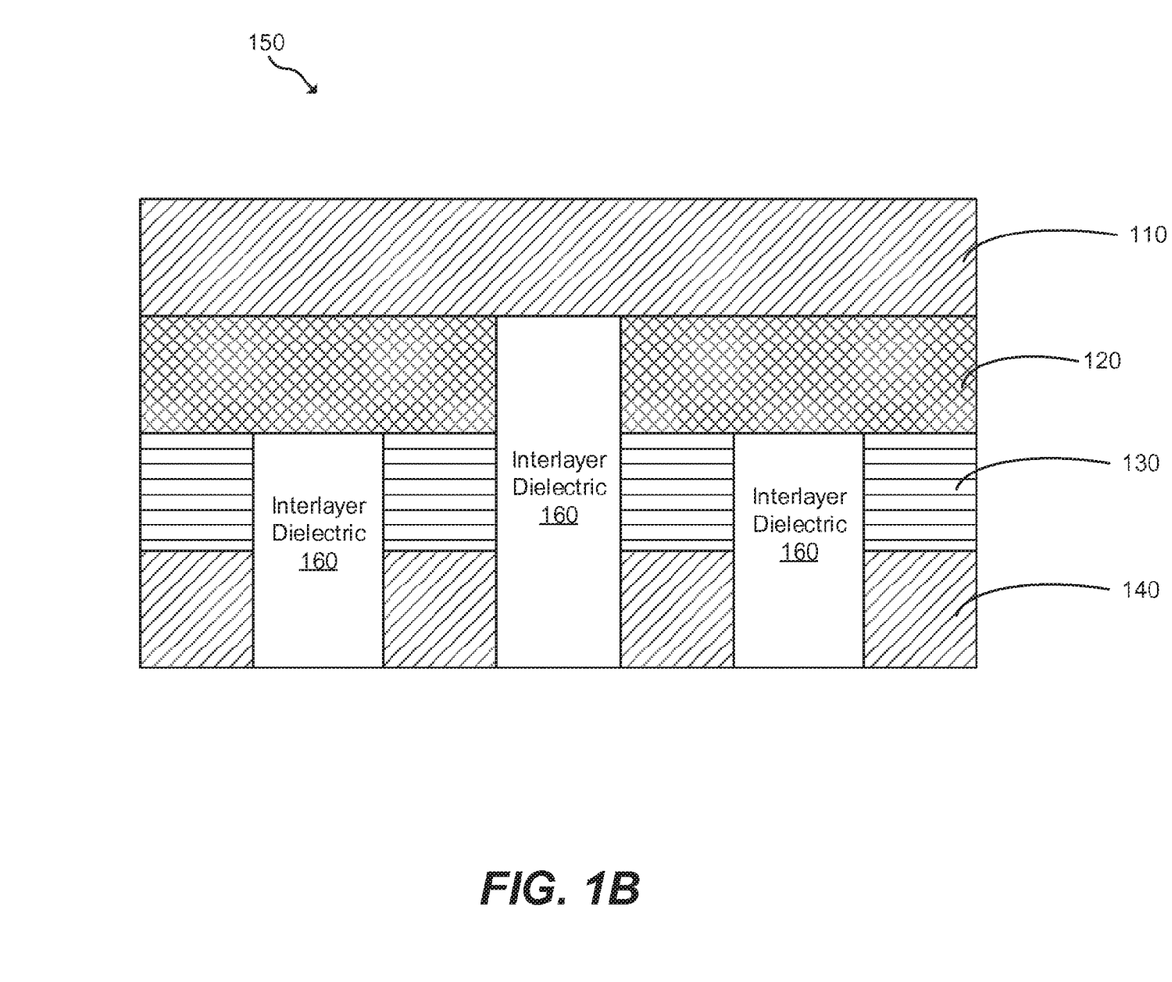
FIG. 1B is a cross-sectional view of an example 1-Selector n-Resistor memristive device having an interlayer dielectric.

FIG. 1B depicts an example 1S2R memristive device 150 which includes a first electrode 110, two selectors 120, four memristors 130, four second selectors 140, and an interlayer dielectric 160. Interlayer dielectric 160 may electrically insulate non-coupled components of memristive device 150. For example interlayer dielectric 160 insulates each memristor 130 and second electrode 140 from adjacent memristors and electrodes within memristive device 150. Furthermore, interlayer dielectric 160 may provide structural support to memristive device 150. FIG. 1B depicts an example 1S2R memristive device, but it should be understood that there are many variations of 1SnR memristive device 150.

Figure 2:
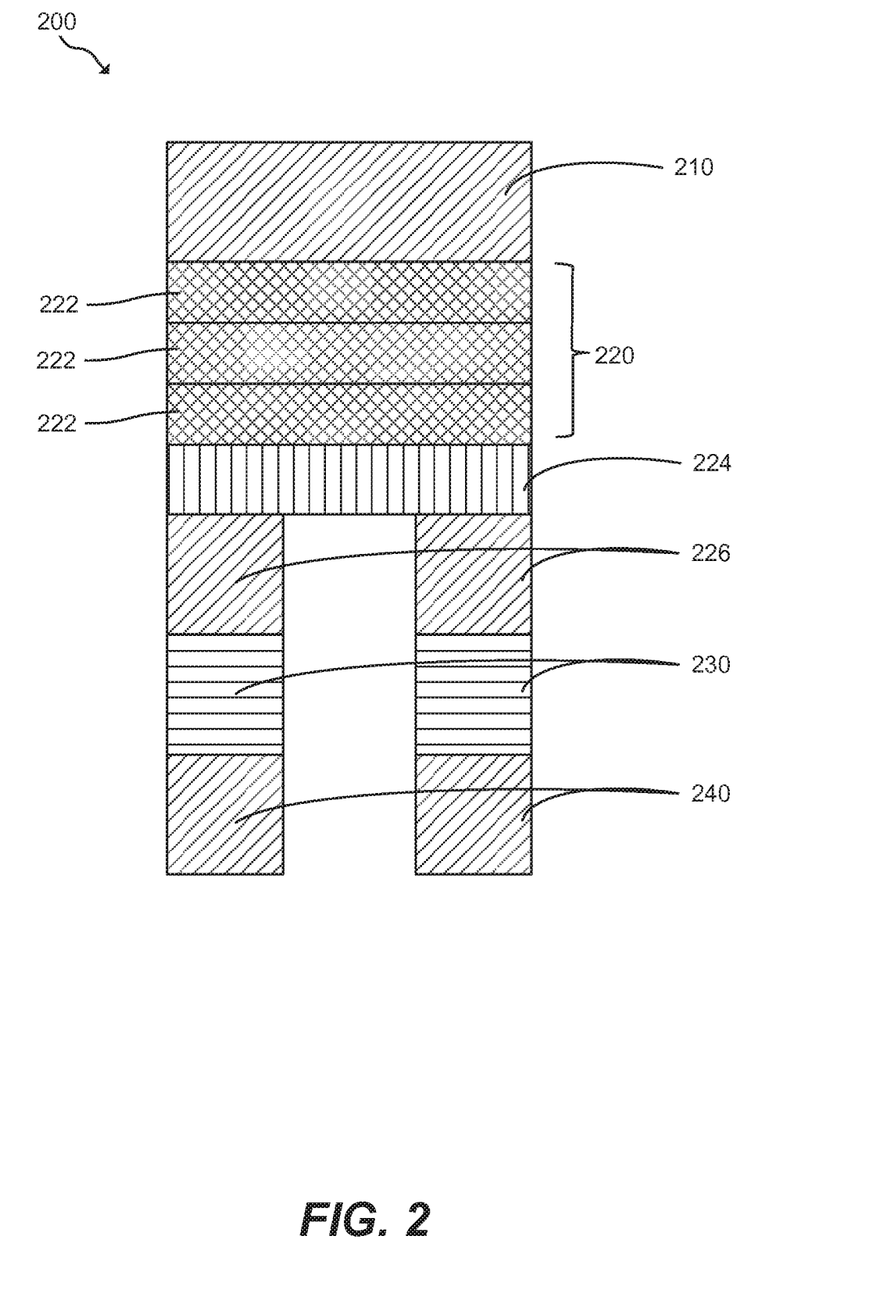
FIG. 2 is a cross-sectional view of an example 1-Selector n-Resistor memristive device having a selector with a three-layer structure.

Interlayer dielectric 160 may have an electrically insulating material, particularly a material with a low dielectric constant. Due to the small scale of the components in memristive device 150, electrical interference may arise between adjacent or neighboring components. Materials with a low dielectric constant may mitigate interference between conducting components of memristive device 150 by electrically isolating each component. Non-limiting example materials for interlayer dielectric 160 may include oxides, nitrides, and carbon-doped oxides FIG. 2 depicts an example 1-Selector n-Resistor memristive device 200 having a crested tunnel barrier selector 220 with a three-layer structure. In some examples, selector 220 may include at least three semiconducting or insulating layers 222 that form a tunneling barrier. One or more layers 222 may include a material that provides a higher energy barrier in the middle of selector 220. An electric field may reduce the peak of the crested energy barrier, allowing a tunneling current to change abruptly, leading to nonlinear I-V behavior. One example of the selector 220 may have a structure of $Ta_3N_5/Ta_2O_5/Ta_3N_5$, with the thickness of each layer being 0.5~5 nm. Furthermore, in some examples, more than three tunneling layers may be used to create crested tunnel barrier selector 220. FIG. 2 depicts an example 1S2R memristive device with a three-layer selector 220, but it should be understood that there are many variations of 1SnR memristive device 200.

In some examples, memristive device 200 may include a current spreading layer 224. Current spreading layer 224 may distribute the current traveling through selector 220 to the targeted memristor 230. Current spreading layer 224 may have a conductance that is dependent on the number of memristors 230 sharing selector 220, as well as the nonlinearity of memristors 230. For example, current spreading layer 224 may have materials of varying conductance, such as metals or certain oxides and nitrides. Electrodes 226 may be coupled between selector 220 and memristors 230. Along with electrode 210 and electrodes 240, electrodes 226 may have a variety of conducting materials.

In some examples, selector 220 may be nitride-based, meaning that at least a portion of selector 220 is formed from a nitride-containing composition. Selector 220 may also be oxide-based, meaning that at least a portion of selector 220 is formed from an oxide-containing material. For example, at least one layer 222 may be nitride-based, and the other layers 222 may be oxide-based. In other examples, all layers 222 are oxide-based; alternatively, all layers 222 are nitride-based.

The three-layer structure of selector 220 may be selected from XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN. As used herein, X represents a compound-forming metal different from Y and Z. For example, compound forming metals X, Y, and Z may be Ta, Hf, Zr, Al, Co, Ni, Fe, Nb, Mo, W, Cu, magnesium (Mg), calcium (Ca), or Ti. The layers of selector 220 may be formed using a variety of techniques, including ion beam assisted deposition, sputtering, atomic layer deposition, evaporation, and chemical vapor deposition.

Figure 3:
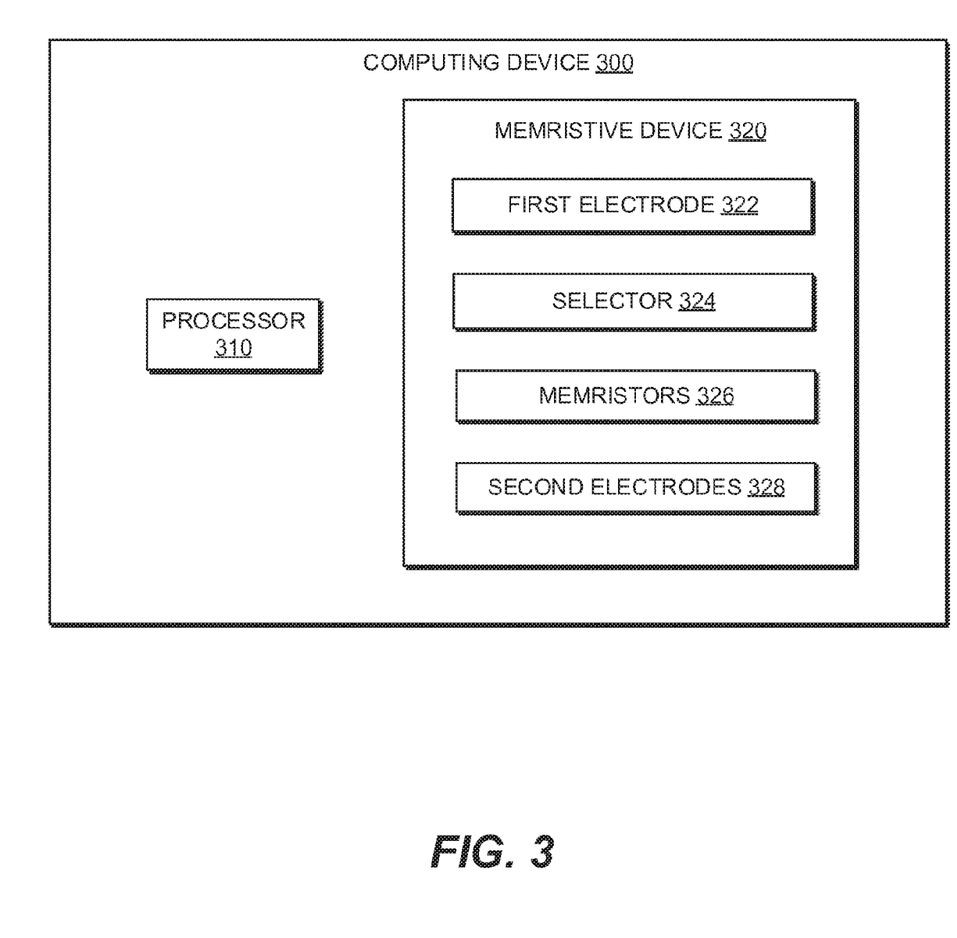
FIG. 3 is a block diagram of an example computing device having an 1-Selector n-Resistor memristive device.

FIG. 3 is a block diagram depicting an example computing device 300 having a 1-Selector n-Resistor memristive device 320 that includes a first electrode 322, a selector 324, a plurality of memristors 326, and a plurality of second electrodes 328. Computing device 300 may be, for example, a notebook or desktop computer, a mobile device, a local area network (LAN) server, a web server, a cloud-hosted server, or any other electronic device that may utilize a memory device or other component having a memristive device. In the implementation of FIG. 3, computing device 300 includes a processor 310.

Processor 310 may be one or more central processing units (CPUs), semiconductor-based microprocessors, and/or other hardware devices suitable for retrieval and execution of instructions stored in a memory device such as random access memory, machine-readable storage medium, or another form of computer data storage. A memory device may have one or more memristive devices 320 that may operate as the storage elements. The switching of each memristor 326 in memristive device 320 between two states allows the representation of a bit, namely a "0" or "1". For example, memristive device 320 may include a dense crossbar array having multiple first electrodes 322, selectors 324, memristors 326, and second electrodes 328, where each memristor 326 acts as a memory cell.

In some implementations, selector 324 may be a crested tunnel barrier selector. As described above in reference to FIG. 1A, a crested tunnel barrier selector may cause memristive device 320 to exhibit I-V nonlinearity. Nonlinearity may improve the selection of individual cells within a crossbar array by mitigating sneak currents through memristive device 320. A crested tunnel barrier selector may possess high endurance values. As described above, a crested tunnel barrier selector utilizes an electric field for switching states and does not involve atomic motion. Accordingly, memristive device 320 with a crested tunnel barrier selector 324 may have a high endurance and may remain robust for a large number of use cycles.

Figure 4A:
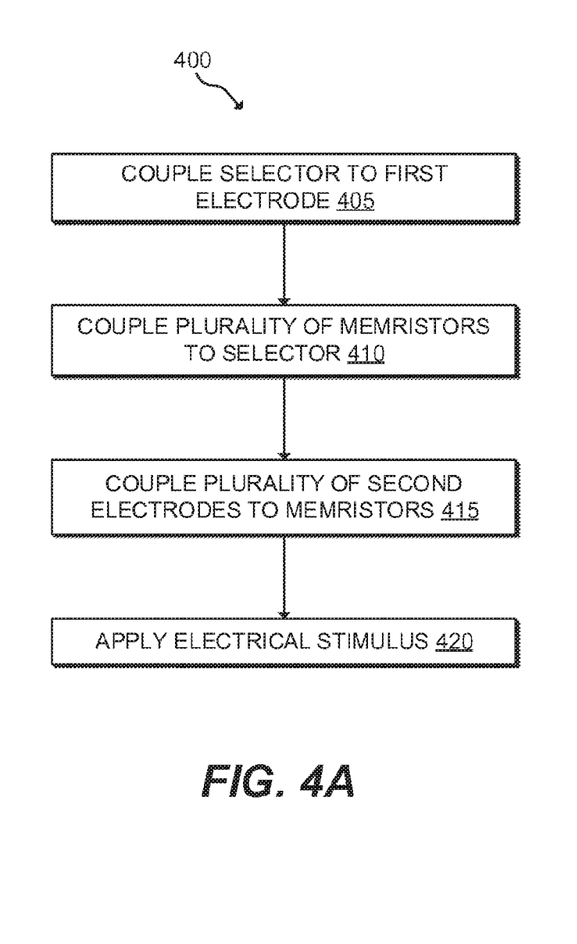
FIG. 4A is a flowchart of an example method for improving performance of a memristive device.

FIG. 4A is a flowchart of an example method 400 for improving performance of a memristive device, which may include step 405 for coupling a selector to a first electrode, step 410 for coupling a plurality of memristors to the selector; step 415 for coupling a plurality of second electrodes to the memristors, and step 420 for applying an electrical stimulus to the memristive device. Although execution of method 400 is herein described in reference to improving the performance of memristive device 100 of FIG. 1A, other suitable parties for implementation of method 400 should be apparent, including, but not limited to, memristive device 150 of FIG. 1B and memristive device 200 of FIG. 2.

Method 400 may start in step 405, where selector 120 is coupled to first electrode 110 via a first interface of selector 120. Coupling may mean an electrically-conducting connection between components. For example, selector 120 may be placed in physical contact with first electrode 110 via a first interface, forming a conducting path through the two components. As described above, selector 120 may be an electrical component that controls the overall electrical properties of memristive device 100. In some examples, selector 120 may be a crested tunnel barrier selector. Furthermore, selector 120 may have a three-layer structure and may include an oxide-based or nitride-based material. First electrode 110 may also include a variety of materials, such as a metal like Pt, Ta, Hf, Zr, Al, Co, Ni, Fe, Nb, Mo, W, Cu, or Ti, or an electrically conducting metal nitride, such as $TiN_x$ or $TaN_x$.

After coupling selector 120, method 400 may proceed to step 410, where a plurality of memristors 130 are coupled to a second interface of selector 120 via a first interface of each memristor 130. The coupling of memristors 130 and selector 120 may form a conducting path through each set of the two components. As described above, memristor 130 may be an electric component which may change resistance with an applied voltage or current. Furthermore, memristor 130 may "memorize" its last resistance. In this manner, each memristor 100 may be set to at least two states, which may be used in memory applications. Memristor 130 may be based on a variety of materials, such as oxides, nitrides, and oxy-nitrides. In addition, other functioning memristors may be employed in the practice of the teachings herein After coupling memristors 130, method 400 may proceed to step 415, where a plurality of second electrodes 140 are coupled to memristors 130 such that each second electrode 140 is coupled to one of the memristors 130 via a second interface of each memristor 130 and such that each memristor 130 is coupled to one second electrode 140. The coupling of memristors 130 and second electrodes 140 may form a conducting path through each set of the two components. Each second electrode 140 may also include a variety of materials, such as a metal like Pt, Ta, Hf, Zr, Al, Co, Ni, Fe, Nb, Mo, W, Cu, or Ti, or an electrically conducting metal nitride, such as $TiN_x$ or $TaN_x$.

After coupling second electrodes 140, method 400 may proceed to step 420, where an electrical stimulus is applied to memristive device 100. An electrical stimulus may be a voltage, current, or some other form of electrical stimulation. Applying an electrical stimulus to memristive device 100 may switch one or more of memristors 130. Alternatively, an electrical stimulus may be applied to memristive device 100 in order to read its resistive state, for example between "on" and "off". In some examples, in order to target a particular memristor 130 for switching or reading, half of a switch or read voltage may be applied to first electrode 110, and the other half of the switch or read voltage may be applied to the particular second electrode 140 that is coupled to the particular memristor 130 being targeted. A half voltage to both first electrode 110 and the second electrode 140 coupled to the targeted memristor 130 may apply the full switch or read voltage to the targeted memristor 130 while applying half of the voltage to the other memristors 130 of memristive device 100.

Figure 4B:
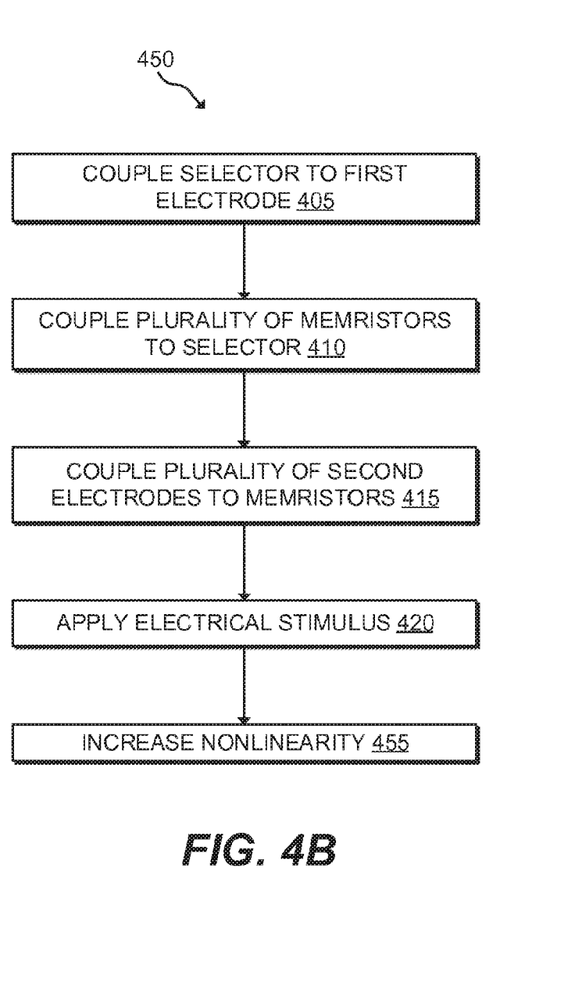
FIG. 4B is a flowchart of an example method for improving performance of a memristive device where nonlinearity is increased.

FIG. 4B is a flowchart of an example method 450 for improving performance of a memristive device where nonlinearity is increased. Method 400 may include method 400 and step 455 for increasing nonlinearity of the memristive device. Although execution of method 400 is herein described in reference to improving the performance of memristive device 100 of FIG. 1A, other suitable parties for implementation of method 450 should be apparent, including, but not limited to, memristive device 150 of FIG. 1B and memristive device 200 of FIG. 2.

Step 455 for increasing nonlinearity of memristive device 100 may occur as a result of step 420 for applying an electrical stimulus through memristive device 100. Selector 120 of memristive device 100 may provide nonlinear I-V characteristics for the device. As described above, the resistance of selector 120 may change abruptly when an applied electric field reaches a certain level or magnitude. For example, a certain voltage may cause a certain current to pass through selector 120. Another voltage of a higher magnitude may, on the other hand, cause a significantly larger current to pass through selector 120. For instance, the first current may be insufficient to switch memristor 130 while the second current is sufficient. When applied to the example operation described in relation to method 400 of FIG. 4A, selector 120 may provide enough current to the targeted memristor 130 for reading or switching, but selector 120 does not provide enough current to the neighboring half-selected memristors 130, thereby not reading or switching the half-selected memristors. In this manner, increasing nonlinearity of memristive device 100 mitigates sneak currents and supports the use of memristive device 100 in crossbar array applications.

The foregoing describes a number of examples for 1-Selector n-Resistor memristive devices having one selector with multiple memristors. It should be understood that the memristive devices described herein may include additional components and that some of the components described herein may be removed and/or modified without departing from the scope of the memristive device. It should also be understood that the components depicted in the figures are not drawn to scale and thus, the components may have different relative sizes with respect to each other than as shown in the figures.

What is claimed is:

1. A 1-Selector n-Resistor memristive device, comprising:
a first electrode;
a selector, wherein a first interface of the selector is coupled to the first electrode;
a plurality of memristors, wherein a first surface of each memristor of the plurality of memristors is coupled to a second interface of the selector; and
a plurality of second electrodes, wherein each second electrode of the plurality of second electrodes is coupled to one of the plurality of memristors via a second surface of the memristor.

2. The memristive device of claim 1, wherein each memristor of the plurality of memristors is coupled to one second electrode of the plurality of second electrodes.

3. The memristive device of claim 1, wherein the selector is a crested tunnel barrier selector.

4. The memristive device of claim 3, wherein the selector comprises at least three layers forming a tunneling barrier, wherein each layer is semiconducting or insulating.

5. The memristive device of claim 4, wherein the selector comprises a three-layer structure selected from the group consisting of XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN,
wherein X represents a compound-forming metal different from Y and Z.

6. The memristive device of claim 5, wherein the compound-forming metals are selected from the group consisting of Ta, Hf, Zr, Al, Co, Ni, Fe, Nb, Mo, W, Cu, Mg, Ca and Ti.

7. The memristive device of claim 1, wherein the memristive device comprises at least four memristors.

8. The memristive device of claim 1, further comprising an interlayer dielectric material electrically insulating non-coupled components of the memristive device.

9. The memristive device of claim 1, wherein the memristive device exhibits nonlinearity with a factor of at least 10 in a voltage range of interest.

10. The memristive device of claim 1, wherein the memristive device exhibits endurance of at least $10^3$.

11. The memristive device of claim 1, further comprising a current spreading layer coupled between the selector and the memristors.

12. A computing device, comprising a processor and a memristive device, wherein the memristive device comprises:
a first electrode;
a selector, wherein a first interface of the selector is coupled to the first electrode;
a plurality of memristors, wherein a first surface of each memristor of the plurality of memristors is coupled to a second interface of the selector; and
a plurality of second electrodes, wherein each second electrode of the plurality of second electrodes is coupled to one of the plurality of memristors via a second surface of the memristor and wherein each of the plurality of memristors is coupled to one of the plurality of second electrodes.

13. The computing device of claim 12, wherein the selector is a crested tunnel barrier selector.

14. A method, comprising:
   coupling a selector to a first electrode, wherein the selector is coupled via a first interface of the selector;
   coupling a plurality of memristors to a second interface of the selector, wherein each memristor of the plurality of memristors is coupled to the second interface of the selector via a first surface of the memristor;
   coupling a plurality of second electrodes to the plurality of memristors, wherein each second electrode of the plurality of second electrodes is coupled to one memristor of the plurality of memristors via a second interface of the memristor and wherein each of the plurality of memristors is coupled to one of the plurality of second electrodes; and
   applying an electrical stimulus to the memristive device.

15. The method of claim 14, wherein the selector is a crested tunnel barrier selector, and further comprising increasing nonlinearity of the memristive device.

* * * * *